United States Patent
Cross

[19]

[11] Patent Number: 5,886,752
[45] Date of Patent: Mar. 23, 1999

[54] SPURIOUS FREE WIDEBAND PHASE AND FREQUENCY MODULATOR USING A DIRECT DIGITAL SYNTHESIS ALIAS FREQUENCY BAND

[75] Inventor: Ray L. Cross, Cedar Rapids, Iowa

[73] Assignee: Rockwell International, Costa Mesa, Calif.

[21] Appl. No.: 995,903

[22] Filed: Dec. 22, 1997

[51] Int. Cl.[6] .................................................. H04N 5/40
[52] U.S. Cl. ........................................ 348/724; 348/723
[58] Field of Search .................................. 348/324, 223, 348/420, 642; 375/300, 302, 316; 332/126, 127, 159, 161, 162, 144

[56] References Cited

U.S. PATENT DOCUMENTS

| | | | |
|---|---|---|---|
| 5,315,619 | 5/1994 | Bhatt | 375/94 |
| 5,343,168 | 8/1994 | Guthrie | 331/126 |
| 5,549,111 | 8/1996 | Wright et al. | 128/742 |
| 5,564,020 | 10/1996 | Rossi | 375/200 |
| 5,708,436 | 1/1998 | Loiz et al. | 342/25 |
| 5,754,437 | 5/1998 | Blazo | 364/484 |
| 5,786,866 | 7/1998 | Sani et al. | 348/520 |
| 5,793,818 | 8/1998 | Claydon et al. | 375/326 |

*Primary Examiner*—Victor R. Kostak
*Attorney, Agent, or Firm*—Kyle Eppele; James P. O'Shaughnessy

[57] ABSTRACT

A wideband phase and frequency modulator using a direct digital synthesis alias frequency band is described. The modulator is spurious free by the utilization of a fixed frequency at the output of the direct digital synthesizer wherein only certain submultiples of the clock frequency are used. Known frequency ratios relative to the clock frequency of the direct digital synthesizer (DDS) cause the DDS to function as a simple divider resulting in extremely low spurious levels when additional conditions are met. An additional frequency synthesizer may be utilized to achieve a tuning range since the DDS output is preferably held at a fixed frequency. At least one additional mixing operation is utilized for upconversion to a microwave frequency. Since fixed frequency ratios are used, implementation simpler than a full DDS may also be constructed consisting of digital modulators, multiplexers, digital to analog convertors, and filters.

29 Claims, 3 Drawing Sheets

SPURIOUS FREE WIDEBAND PHASE AND FREQUENCY MODULATOR USING A DIRECT DIGITAL SYNTHESIS ALIAS FREQUENCY BAND

BACKGROUND OF THE INVENTION

The present invention generally relates to the field of video transmitters, and more particularly to a wideband precision phase modulator for utilization in video transmitters.

A desire existed for a wideband precision phase modulator for utilization in video transmitters. Typical implementations of wideband precision phase modulators comprise analog voltage controlled phase shifters, I/Q modulators, or wideband phase locked loops. All of the prior art analog modulator designs are adversely affected by environmental conditions such as temperature and vibration, especially when wide modulating frequency bandwidths are required. However, a completely digital implementation of a wideband precision phase modulator would not suffer from adverse vibration and temperature environmental conditions.

The principle of modulating a direct digital synthesizer (DDS) for phase or frequency modulation is well known. However, where high precision wideband modulation is desired (i.e. greater than 10 megapixels per second of video) the existing DDS designs do not meet stringent design criteria.

The specifications for high precision wideband video dictate extremely low spurious levels. For an arbitrary tuning frequency, the spurious levels of available DDS designs do not meet these requirements. The DDS is further required to have a high clock frequency to properly sample the input modulation, equivalent to meeting a Nyquist criteria, and to provide an output high enough in frequency to avoid multiple frequency upconversions to the final frequency band. Available DDS devices either provide an adequate number of phase modulation bits but have an insufficient overall clock frequency, or provide an adequate clock frequency but have an insufficient number of modulation bits.

SUMMARY OF THE INVENTION

Accordingly, it is a goal of this invention to provide a digitally implemented wideband precision modulator for utilization in a video transmitter which is spurious free.

The solution to the spurious problem of the present invention is to use a fixed frequency at the output of the DDS wherein only certain submultiples of the clock frequency are used. Known frequency ratios relative to the clock frequency of the DDS cause the DDS to function as a simple divider resulting in extremely low spurious levels when additional conditions are met. An additional frequency synthesizer may be utilized to achieve a tuning range since the DDS output is preferably held at a fixed frequency. At least one additional mixing operation is utilized for upconversion to a microwave frequency. Since a fixed frequency ratio is used, the method can also be implemented with much simpler hardware than a full DDS.

It is to be understood that both the foregoing general description and the following detailed description are exemplary and explanatory only and are not restrictive of the invention as claimed.

The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DESCRIPTION OF THE PREFERRED EMBODIMENT

Reference will now be made in detail to the presently preferred embodiment of the invention, an example of which is illustrated in the accompanying drawings.

Figure 1:
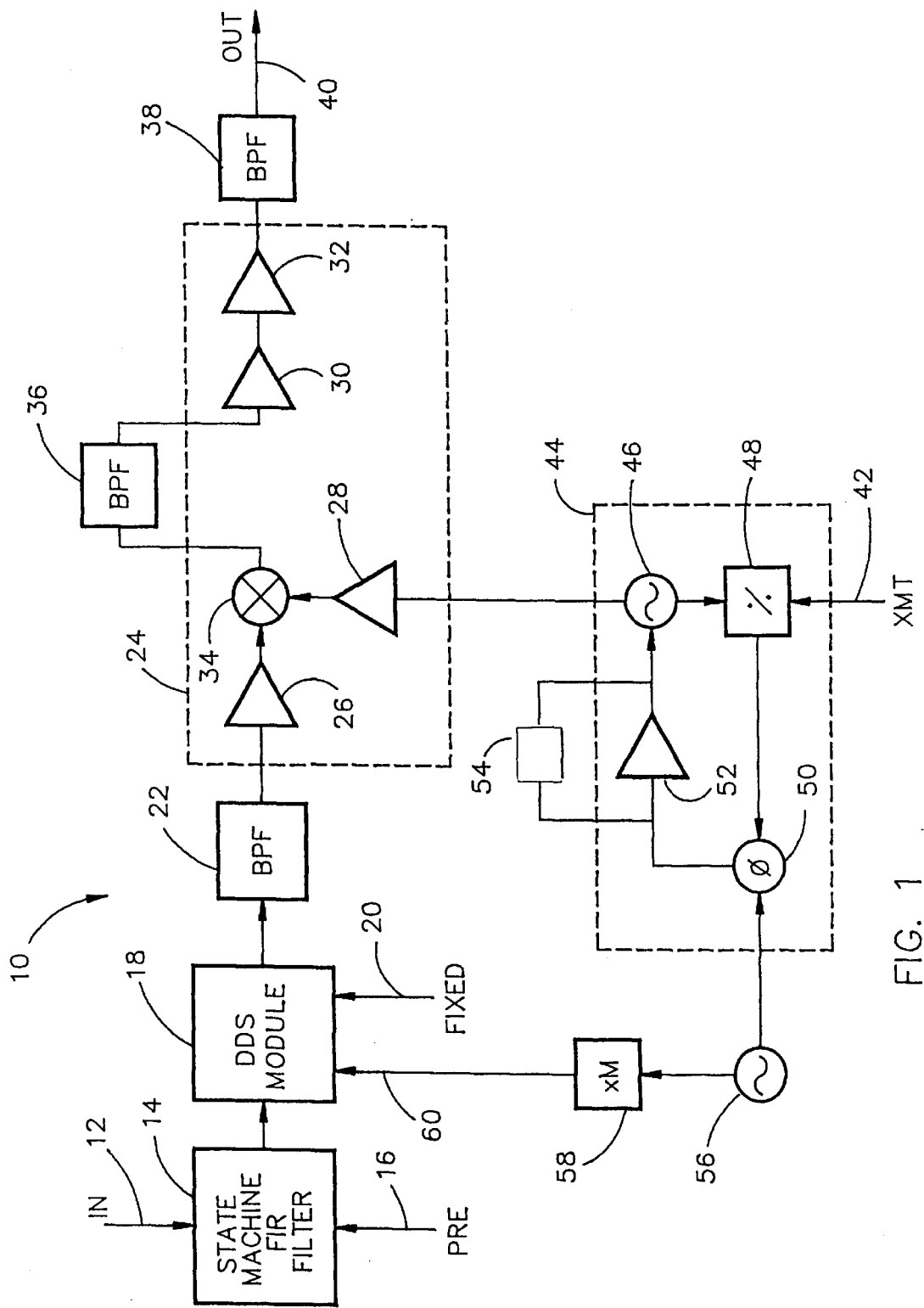
FIG. 1 shows a modulator in accordance with the present invention.

Referring now to FIG. 1, a modulator in accordance with the present invention is shown. The modulator 10 is utilized to convert high speed video information into an RF phase modulated waveform. Alternatively, the video information may be converted into an RF frequency modulated waveform. To achieve a preferred 480 pixels per line of video, the video rate is 10 megapixels per second corresponding to a 5 MHz analog bandwidth. The modulator should have at least 8-bit precision in the phase range of ±1 radian. The phase range is preferably ±pi radians.

The modulator 10 receives a digital video signal as an input ("IN") 12. A digital state machine ("STATE MACHINE FIR FILTER") 14 implements pre-emphasis filtering of the digital video input signal. Digital finite impulse response (FIR) filters are utilized in the pre-emphasis stage. The output of the video board, the digital video input, is preferably oversampled. The state machine 14 preferably includes a pre-emphasis control input ("PRE") 16.

Line oriented pre-emphasis filtering of the incoming video information is utilized to enhance the high frequency content which is performed by the video generator module. It is desired that the phase response of the video system is more critically controlled than the amplitude response.

The output of the state machine feeds into a modulation port of a direct digital synthesis module ("DDS MODULE") 18. The DDS module further receives a DDS fixed frequency control input 20.

A direct digital synthesis modulator is utilized to achieve higher resolution PM video or wideband FM with tightly defined frequency stability criteria. The DDS is utilized at a fixed frequency which is converted to the desired frequency by traditional means. Frequency multiplication of the output or up-conversion mixing may be utilized. A DDS operating directly at the 240 MHz intermediate frequency is the desired approach. The clock frequencies utilized must be carefully chosen to avoid pixel and synchronization code jitter. The video generator and the DDS must be locked to the same frequency reference.

The output of the DDS module is fed through a bandpass filter ("BPF") 22 having a preferable center frequency of 240 MHz. The bandpass filtered signal feeds into the input of an exciter 24 which is preferably implemented on a gallium-arsenide monolithic microwave integrated circuit (GaAs MMIC). Exciter 24 comprises amplifiers 26, 28, 30 and 32 and mixer 34. Further, the output of mixer 34 is passed through an external bandpass filter 36 and fed back into the input of amplifier 30. The output of amplifier 32 is the output of the exciter which is further filtered by bandpass filter 38 to provide a frequency hopping FM or PM modulated analog signal output ("OUT") 40 which is fed into a power amplifier for broadcast.

A transmitter frequency control input ("XMT") 42 is used as a control input to a tuned frequency phase locked loop local upconvert local oscillator 44. The local oscillator 44 comprises a sinewave generator 46, divider element 48, phase detector 50 and amplifier 52. Additionally, external filtering 54 is connected between the output and input of amplifier 52. An external sinewave generator 56 provides a frequency reference to the local oscillator and also provides a clock signal 60 to the DDS module 18 after being multiplied to the desired clock frequency with frequency multiplier 58.

The DDS module 18 is preferably clocked at 322.56 MHz. The range of 0 to ½ the clock frequency would then be the normal frequency output. In this case the first alias band, which ranges from ½ to 1 times the clock frequency, is the output which is used. To achieve the extremely low spurious requirements for the video, only certain submultiples of the clock frequency are used. This is due to finite truncation effects in the registers of the DDS 18. The submultiple that produces the least spurious with the greatest frequency separation is ¼ the clock frequency. Because of the use of the first alias band, the output frequency is ¾ the clock rate; ¼ the clock rate on each side of the intended output frequency is entirely spur free. For 322.56 MHz, for example, this provides an intended output frequency 241.92 MHz with a spur free band ±80.64 MHz band on either side of the 241.92 MHz output. This allows adequate frequency range to separate the direct and other digital alias components off of the signal. The signal is filtered to a narrower bandwidth to support the bandwidth requirements of the system.

In general, the clock frequency may be selected to support other system requirements, including the rate at which modulation data is clocked into the DDS 18. The clock for the modulation data is chosen so that the sidebands produced by the modulation process produce alias components that map to favorable frequencies.

The range of 0 to ½ the clock frequency would be the normal frequency output. When an alias band is used, such as in the case of a target application wherein the first alias band which ranges from ½ to 1 times the clock frequency, a higher output frequency can be achieved. Alias frequency bands are a natural consequence of the sampled nature of the DDS. The alias components are based in the clock frequency used in the DDS. The direct frequency range extends from 0 to ½ the clock rate, the first alias band extends from ½ to 1 times the clock rate, the third alias band extends from 1 to 3/2 times the clock rate, the fourth alias band extends from 3/2 to 2 times the clock rate, and so on. The direct output extending from 0 to ½ the clock rate is the normally used frequency range due to its better desired ratio of output to spurious level performance. Utilization of the alias band for general frequency synthesis purposes typically has not favored due to the increased relative spurious levels. However, the present invention provides alias band frequency synthesis which is spurious free.

For a modulation scheme that uses the DDS 18 for its precision modulation capabilities and not its tuning agility, the spurious signals may not be a problem. By choosing a fixed output frequency for low spurious generation the alias band can be used for modulation. The submultiple that produces the least spurious with the greatest frequency separation between alias bands is ¼ the clock frequency. For example if a DDS modulator is clocked at 300 MHz the direct frequency synthesis range would extend from 0 to 150 MHz. By selecting a fixed output frequency of 75 MHz low spurious levels are obtained. The DDS 75 MHz output could be used directly and upconverted to the final output frequency but may result in more upconversion mixes than desired. By using the first alias band at 225 MHz the number of mixes could be reduced. Other alias bands could possibly be used, however increasing penalties on signal-to-noise ratios result as progressively higher bands are used. For example, all odd multiples of ¼ the clock rate could be used (e.g., 75 MHz, 225 MHz, 375 MHz, 525 MHz, etc.)

Because the first alias band is the preferred band, the output frequency is at ¾ the clock frequency. As a result, there is a band of frequencies ¼ the clock rate on each side of the intended output frequency which is entirely spur free. For the 300 MHz example this gives an intended output frequency of 225 MHz with a spur free band ±75 MHz band either side of the output. This allows adequate frequency range to separate the direct and other digital alias components off of the signal. The signal may be filtered to a narrower bandwidth to support the bandwidth requirements of the system.

Phase and frequency modulations produce multiple sidebands that are harmonically related to the modulating waveforms. If a DDS running at ¼ the clock rate were to be phase modulated with a digital representation of a sinewave then the DDS clock frequency to modulation frequency ratio should be an integer divisible by two. If not, the aliased higher order sidebands of the phase modulation process will appear between the components of the direct modulation sideband. For square wave modulation additional criteria on the sidebands require that the ratio of DDS clock to modulation rate be an integer divisible by four. Video represented as a stream of digitized pixels acts similar to the square wave modulation case.

For DDS outputs other than the ¼ clock rate the requirements for square wave modulation are:

$$F_{CLOCK}/F_{MOD}=2(N)/(1-2A)$$

where $F_{CLOCK}$ is the DDS clock frequency, $F_{MOD}$ is the digital modulation rate of the primary square wave (or digital data clock rate), N is an integer greater than three, and A is the ratio of the DDS direct output frequency to the DDS clock frequency. As an additional criterion, the ratio of FCLOCK to FMOD must also be an integer.

Figure 2:
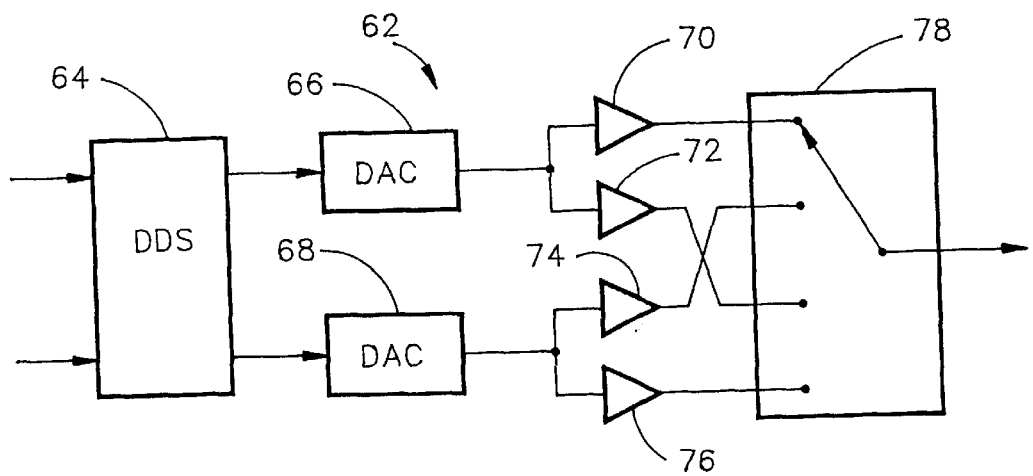
FIG. 2 shows a high RF modulated direct digital synthesis apparatus.

Referring now to FIG. 2, an alternate high frequency RF modulated DDS apparatus is shown. The apparatus provides a high RF modulated output from a low speed DDS modulator. The modulator 62 comprises a direct digital synthesizer ("DDS") 64 providing digital sine and cosine outputs to a pair of digit-to-analog converters ("DAC") 66 and 68. The outputs of the DACs are buffered with amplifiers 70, 72, 74 and 76 as shown, the outputs of which being multiplexed with a four-to-one analog multiplexer 78.

Figure 3:
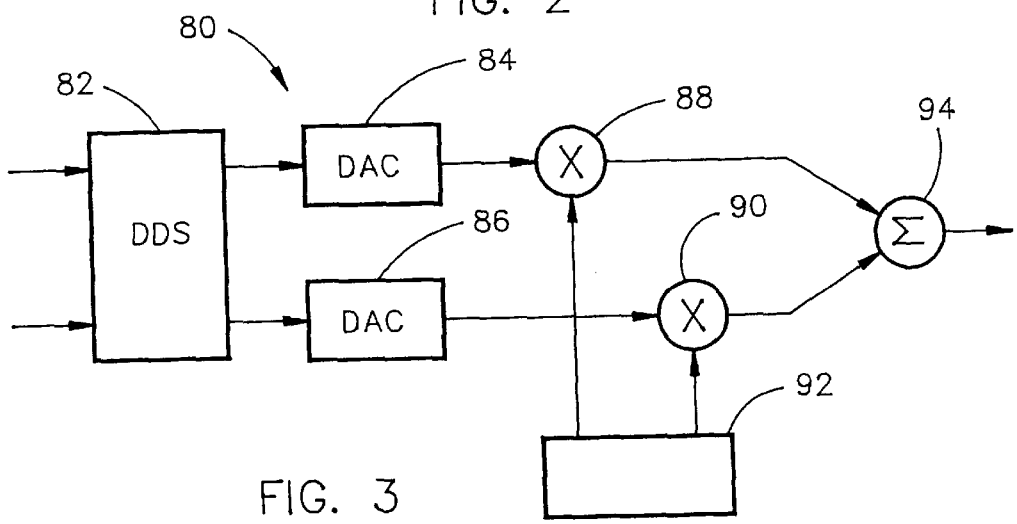
FIG. 3 shows a mathematical equivalent diagram of the RF modulated direct digital synthesis apparatus.

Referring now to FIG. 3, a mathematical equivalent diagram of the RF modulated DDS apparatus of FIG. 2 is shown. The apparatus shown in FIG. 2 is mathematically equivalent to an I/Q mixer scheme mixer scheme 80 as shown in FIG. 3. The I/Q scheme would comprise DDS 82 and pair of DACs 82 and 84 similar to the scheme of FIG. 2. The difference being the outputs of the DACs are mixed with an I/Q modulator 92 at mixers 88 and 90, the outputs of which are combined with a summing element 94.

Figure 4:
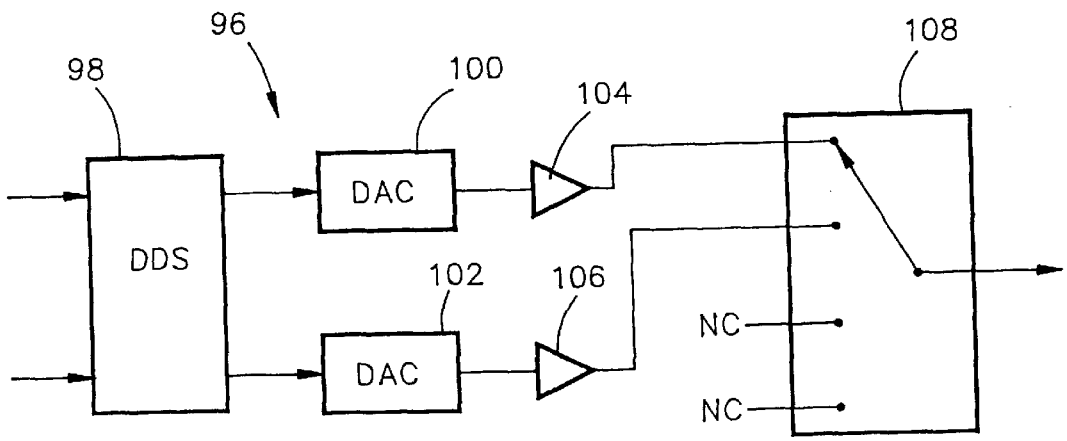
FIG. 4 shows a reverse bandpass sampler in accordance with the present invention.

Referring now to FIG. 4 a reverse bandpass sampler in accordance with the present invention is shown. The reverse bandpass sampler 96 comprises a direct digital synthesizer 98 providing digital outputs to a pair of digital-to-analog converters 100 and 102, the outputs of which being buffered by amplifiers 104 and 106. The outputs of amplifiers 104 and 106 are feed into a four-to-one analog multiplexer 108 as shown. However, two of the inputs to multiplexer 108 have null connections ("NC") as shown.

Figure 5:
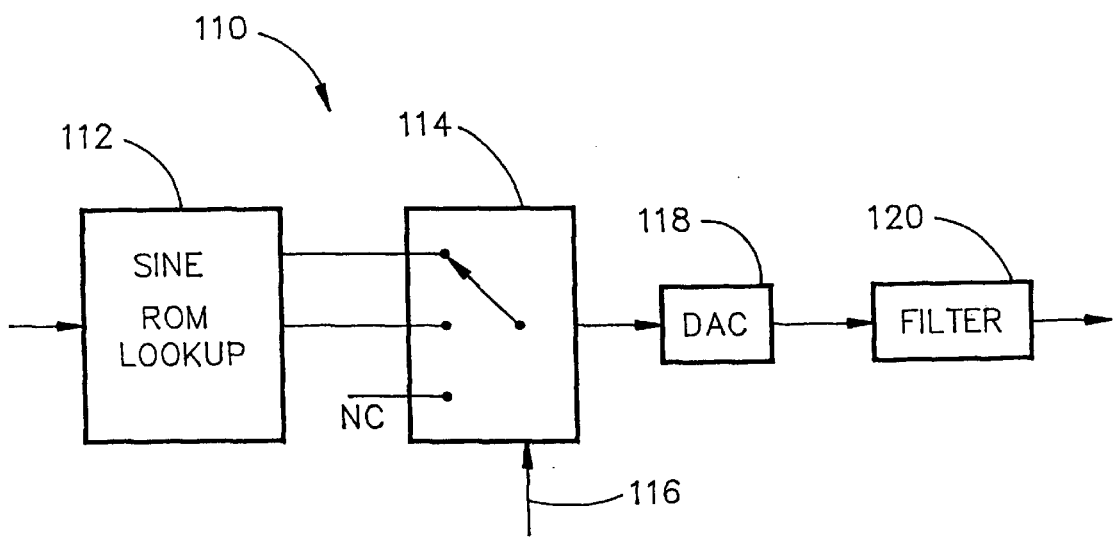
FIG. 5 shows a multiplexed digital-to-analog converter for the modulator of the present invention.

Referring now to FIG. 5, a multiplexed DAC for the modulator of the present invention is shown. The methods of multiplexing an analog digital-to-analog converter for the modulator 110 of FIG. 5 would have the same balance (i.e. amplitude and phase) problems as I/Q modulators such as the modulator 80 of FIG. 3. This problems is eliminated by placing the multiplexer 114 before the DAC 118. The modulator 110 comprises a sine look-up table stored in a ROM memory ("SINE ROM LOOKUP") 112 in which a map of a sinusoidal waveform is stored to provide sine and cosine digital outputs. The sine and cosine outputs are fed into a three-to-one digital multiplexer 114 wherein the third input terminal has a null connection ("NC"). The multiplex rate may varied with control input 116. The selection of the sine from outputs as opposed to the null connection is dependent on the desired output frequency and the alias band used. The output of the multiplexer 114 feeds into a digital-to-analog converter 118 which in turn is passed through filter 120.

Figure 6:
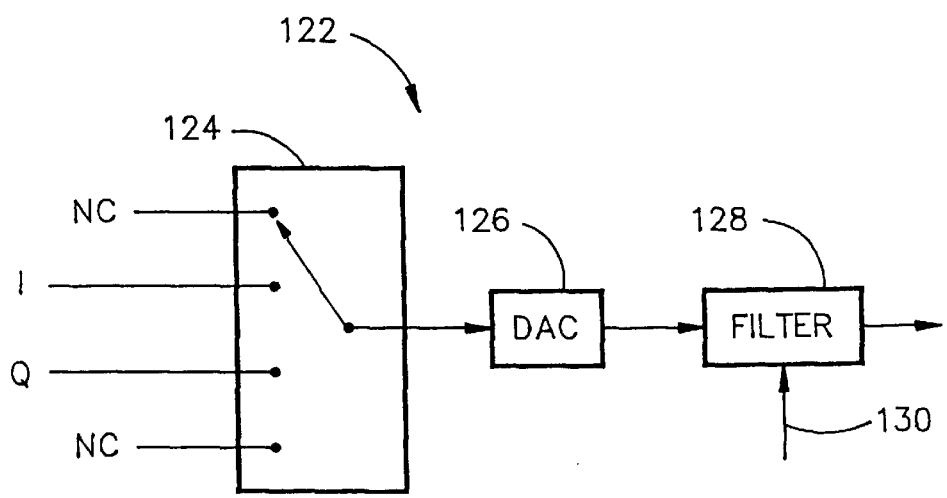
FIG. 6 shows a generic alias band, bandpass sampler for the modulator of the present invention.

Referring now to FIG. 6, a generic alias band, "reverse" bandpass sampler for the modulator of the present invention is shown. The bandpass sampler 122 comprises a four-to-one digital multiplexer 124 receiving in-phase ("I") and quadrature ("Q") signals with the remaining two terminals being null connected as shown. The output of the multiplexer is fed through a digital-to-analog converter 126, the output of which is filtered with filter 128. The center frequency of filter 128 may be varied with control input 130.

The present invention as described herein provides a powerful generic modulation technique. FIGS. 2–5 show a concept for an alias band modulation technique using either a DDS, or just a sine/cosine ROM running at the modulation rate and either a digital or analog multiplexing technique operating at a much higher clock rate. Because of the properties of digital aliasing, it is not necessary to create all the clock components at the higher sampling rate. In some ways this resembles the concept of "bandpass sampling" used to create I and Q digital samples from an analog bandpass signal but used in the "reverse" direction. It was realized that this concept was not restricted to the phase modulation case. Any high frequency analog bandpass signal with the appropriate filters may be created from generic I and Q digital signals. Although the concept of bandpass sampling is frequently used for analog-to-digital conversion, the reverse process has not been implemented.

It is believed that the spurious free wideband phase and frequency modulator using a direct digital synthesis alias frequency band of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A direct digital synthesis modulator for modulating a video signal, comprising:
    a digital state machine receiving a digital video input signal;
    a direct digital synthesis module receiving an output signal from said digital state machine for providing direct digital synthesis of the output signal;
    a tuned frequency local oscillator providing a modulating output signal from a transmitter frequency control signal; and
    an exciter receiving the modulating output signal from said tuned frequency local oscillator for providing a modulated video signal to be transmitted.

2. A direct digital synthesis modulator as claimed in claim 1, wherein said digital state machine implements a finite impulse response filter.

3. A direct digital synthesis modulator as claimed in claim 1, wherein said digital state machine receives a pre-emphasis control signal for pre-emphasis filtering of the digital video input signal.

4. A direct digital synthesis modulator as claimed in claim 1, wherein said direct digital synthesis module receives a fixed frequency control input.

5. A direct digital synthesis modulator as claimed in claim 1, further comprising a bandpass filter operationally connected between said direct digital synthesis module and said exciter.

6. A direct digital synthesis modulator as claimed in claim 5, wherein said bandpass filter has a center frequency set to center of the alias band component.

7. A direct digital synthesis modulator as claimed in claim 1, wherein said tuned frequency local oscillator is a phase locked loop.

8. A direct digital synthesis modulator as claimed in claim 1, wherein said tuned frequency local oscillator is a phase locked loop or other signal source.

9. A direct digital synthesis modulator as claimed in claim 1, wherein said exciter is a monolithic microwave integrated circuit.

10. A direct digital synthesis modulator as claimed in claim 1, wherein said exciter is a gallium-arsenide monolithic microwave integrated circuit.

11. A direct digital synthesis modulator as claimed in claim 1, further comprising a bandpass filter at the output of said exciter.

12. A direct digital synthesis modulator as claimed in claim 1, wherein said exciter provides a frequency modulated video output signal.

13. A direct digital synthesis modulator as claimed in claim 1, wherein said exciter provides a phase modulated video output signal.

14. An alias band bandpass sampler for a video modulator, comprising:
    a direct digital synthesizer providing a digital sinusoidal output, said direct digital synthesizer being driven with a clock signal;
    a multiplexer receiving said digital sinusoidal output from said direct digital synthesizer for providing a multiplexed output signal;
    a digital-to-analog converter receiving the multiplexed output signal from said multiplexer for converting the multiplexed output signal into an analog signal; and a filter receiving the analog signal for removing undesired frequency components from the analog signal to provide an output signal.

15. An alias band bandpass sampler as claimed in claim 14, wherein said multiplexer is a four-to-one multiplexer.

16. An alias band bandpass sampler as claimed in claim 14, wherein said multiplexer is a three-to-one multiplexer.

17. An alias band bandpass sampler as claimed in claim 14, wherein said filter includes a control input for varying the center frequency of said filter to select the desired band of the output signal.

18. An alias band bandpass sampler as claimed in claim 14, wherein said filter selects a first alias band at ½ to 1 times the frequency of the clock signal.

19. An alias band bandpass sampler as claimed in claim 14, wherein said filter selects a fixed output frequency of ¼ times the frequency of the clock signal.

20. An alias band bandpass sampler as claimed in claim 14, wherein said filter selects a fixed output frequency of ¾ times the frequency of the clock signal.

21. An alias band bandpass sampler as claimed in claim 14, wherein said filter selects a fixed output frequency of an odd multiple of ¼ times the frequency of the clock signal.

22. An alias band bandpass sampler for a video modulator, comprising:
   a direct digital synthesizer providing digital sine and cosine outputs, said direct digital synthesizer being driven with a clock signal;
   a multiplexer receiving said digital sine and cosine outputs from said direct digital synthesizer for providing a multiplexed output signal;
   a digital-to-analog converter receiving the multiplexed output signal from said multiplexer for converting the multiplexed output signal into an analog signal; and
   a filter receiving the analog signal for removing undesired frequency components from the analog signal to provide an output signal.

23. An alias band bandpass sampler as claimed in claim 22, wherein said multiplexer is a four-to-one multiplexer.

24. An alias band bandpass sampler as claimed in claim 22, wherein said multiplexer is a three-to-one multiplexer.

25. An alias band bandpass sampler as claimed in claim 22, wherein said filter includes a control input for varying the center frequency of said filter to select the desired band of the output signal.

26. An alias band bandpass sampler as claimed in claim 22, wherein said filter selects a first alias band at ½ to 1 times the frequency of the clock signal.

27. An alias band bandpass sampler as claimed in claim 22, wherein said filter selects a fixed output frequency of ¼ times the frequency of the clock signal.

28. An alias band bandpass sampler as claimed in claim 2, wherein said filter selects a fixed output frequency of ¾ times the frequency of the clock signal.

29. An alias band bandpass sampler as claimed in claim 22, wherein said filter selects a fixed output frequency of an odd multiple of ¼ times the frequency of the clock signal.

* * * * *